United States Patent
Hirotsu et al.

(10) Patent No.: US 7,943,523 B2
(45) Date of Patent: May 17, 2011

(54) PLASMA ETCHING METHOD AND COMPUTER READABLE STORAGE MEDIUM

(75) Inventors: Shin Hirotsu, Nirasaki (JP); Wakako Naito, Nirasaki (JP); Yoshinori Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 998 days.

(21) Appl. No.: 11/677,759

(22) Filed: Feb. 22, 2007

(65) Prior Publication Data

US 2008/0045031 A1 Feb. 21, 2008

Related U.S. Application Data

(60) Provisional application No. 60/780,372, filed on Mar. 9, 2006.

(30) Foreign Application Priority Data

Feb. 28, 2006 (JP) ................................ 2006-052894

(51) Int. Cl.
H01L 21/302 (2006.01)
H01L 21/461 (2006.01)

(52) U.S. Cl. .......................... 438/714; 438/729; 438/710

(58) Field of Classification Search .................... 438/716
See application file for complete search history.

(56) References Cited

U.S. PATENT DOCUMENTS

| | | | |
|---|---|---|---|
| 4,812,712 A * | 3/1989 | Ohnishi et al. | 315/176 |
| 6,833,325 B2 * | 12/2004 | Huang et al. | 438/714 |
| 2004/0214445 A1 * | 10/2004 | Shimizu et al. | 438/706 |
| 2006/0037701 A1 | 2/2006 | Koshiishi et al. | |

FOREIGN PATENT DOCUMENTS

JP 2005-26348 1/2005

OTHER PUBLICATIONS

Nishioka et al, Effect of Electric Field on Electron Cyclotron Resonance Plasma Etching, Nov. 1995, Japanese Hournal of Applied Physics, vol. 35, pp. 5998-6002.*
Sin et al, Resist Trimming Technique in CF4/O2 High Density Plasma for sub 0.1 um MOSFET Fabrication using 248 nm Lithography, 2003, Microelectronic Engineering, vol. 65, pp. 394-405.*
Lee et al, Effect of Additive Gases on Dimension Control during Cl2 Based Polysilicon Gate Ethcing, Jul. 1998, Japanese Journal of Applyied Physics, vol. 37, pp. 3889-3893.*

* cited by examiner

*Primary Examiner* — Nadine G Norton
*Assistant Examiner* — Stephanie Duclair
(74) *Attorney, Agent, or Firm* — Oblon, Spivak, McClelland, Maier & Neustadt, L.L.P.

(57) ABSTRACT

A plasma etching method for plasma-etching an anti-reflective coating formed on a target object includes the step of placing the target object into a processing chamber having a first electrode and a second electrode provided while facing each other, the target object including an etching target film, the anti-reflective coating and a patterned photoresist film sequentially formed in that order on a substrate. The plasma etching method further includes the steps of introducing a processing gas into the processing chamber; generating a plasma by applying a high frequency power to one of the first electrode and the second electrode; and applying a DC voltage to one of the first electrode and the second electrode.

10 Claims, 13 Drawing Sheets

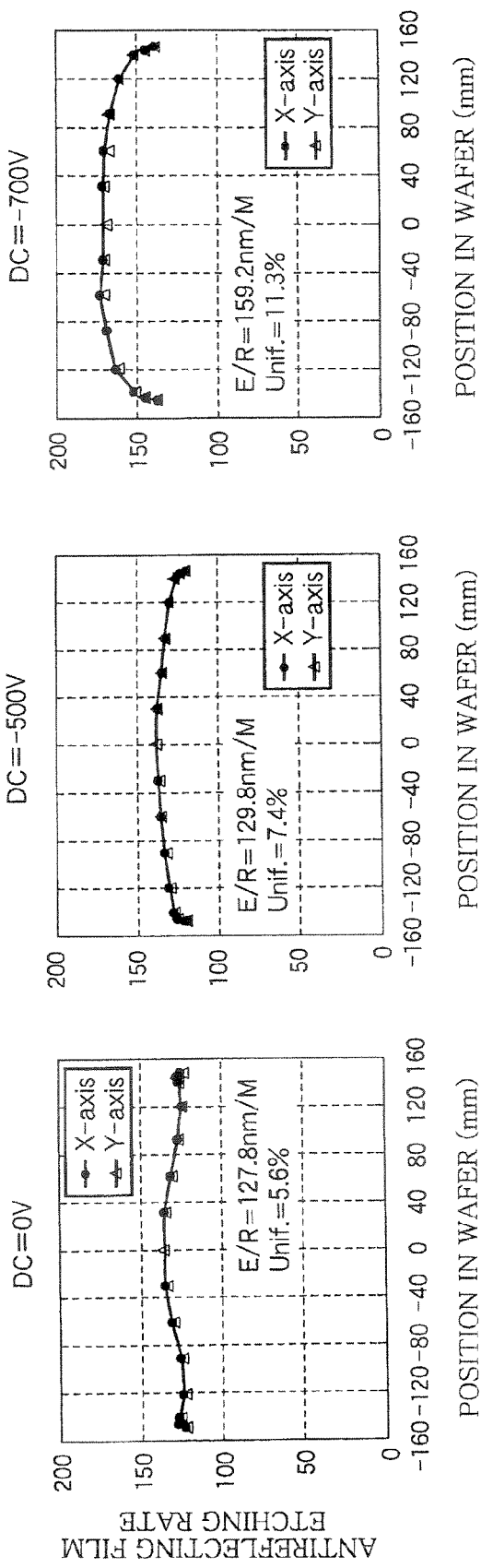

PLASMA ETCHING METHOD AND COMPUTER READABLE STORAGE MEDIUM

FIELD OF THE INVENTION

The present invention relates to a plasma etching method for plasma-etching an anti-reflective coating formed on an object substrate such as a semiconductor substrate and also relates to a computer-readable storage medium.

BACKGROUND OF THE INVENTION

In a manufacturing process of a semiconductor device, a photoresist pattern is formed on a semiconductor wafer, i.e., an object substrate through a photolithography process and etching is performed by using the photoresist pattern as a mask. At the time when an ultra fine pattern is formed, however, it is unavoidable that optical properties of an etching target film underlying the photoresist film and CD (critical dimension) of the photoresist pattern are varied by standing waves; reflection notching; and the diffraction and reflection light coming from an etching target film. Thus, in an effort to prevent light reflection from the etching target film, an anti-reflective coating made of a material exhibiting good light absorption property in a wavelength band of the light used in an exposure light source is interlaid between the etching target film and the photoresist film.

The anti-reflective coatings are generally classified into inorganic anti-reflective coatings and organic anti-reflective coatings, the latter being used mainly in recent years. Plasma etching that makes use of the photoresist film as a mask is employed in etching the anti-reflective coating (see, e.g., Japanese Patent Laid-open Application No 2005-26348).

To meet recent requirements for a fine processing in a photolithography technology, an ArF photoresist capable of forming pattern apertures of about 0.13 μm or less is used as an etching mask. However, the ArF photoresist shows a low plasma resistance to thereby tend to develop a problem of enlarging a CD. Therefore, in assuring a desired CD, etching property of an anti-reflective coating that is kept in direct contact with an etching target film is a critical issue.

However, it is intrinsically difficult to achieve an etching uniformity in the anti-reflective coating. Further, although there are a variety of anti-reflective coatings having different etching characteristics, there is no known process parameter that can be generally applied in controlling the variety of etching characteristics. For this reason, it is impossible to properly control an in-plane etching distribution (etching uniformity), and large variations in CD can easily develop in a later etching process of the etching target film, which cannot be easily overcome.

Meanwhile, on account of a wavelength of the light used in an exposure process, there is a limit in resolution intrinsically imposed on the photolithography technology set forth above. This usually makes it difficult to form an opening of a dimension smaller than the limit of resolution on the photoresist film. Recently, the increasing progress in miniaturization of semiconductor devices requires a CD smaller than that of the ArF photoresist film. In order to comply with this requirement, there has been proposed a method of shrinking a CD in an anti-reflective coating (see, e.g., International Publication No. 03/007357). This method employs a technique that realizes a critical dimension smaller than an initially available one by forming a deposition on an etched sidewall during an etching process of the anti-reflective coating. Examples of this method include a method of using a parallel plate type etching apparatus in an etching process to increase the intensity of a high frequency power applied to an upper electrode and a method of employing a gas prone to form a deposition, such as $C_4F_8$ gas or the like, as an etching gas.

However, the former method results in a poor etching uniformity while it is difficult to achieve a desired etching rate by employing the latter method, which leads to a reduced throughput.

SUMMARY OF THE INVENTION

In view of the problems referred to above, it is an object of the present invention to provide a plasma etching method capable of controlling plasma over a broad extent in a process of etching an anti-reflective coating, thereby controlling an etching characteristic distribution and eventually controlling a critical dimension distribution in a subsequent etching process for an etching target film.

Another object of the present invention is to provide a plasma etching method capable of realizing desired critical dimension shrinkage in a process of etching an anti-reflective coating without marring an etching uniformity and with no reduction of an etching rate.

A further object of the present invention is to provide a computer-readable storage medium that stores a program for executing such a plasma etching method.

In accordance with one aspect of the present invention, there is provided plasma etching method for plasma-etching an anti-reflective coating formed on a target object, comprising the steps of:

placing the target object into a processing chamber having a first electrode and a second electrode provided while facing each other, the target object including an etching target film, the anti-reflective coating and a patterned photoresist film sequentially formed in that order on a substrate;

introducing a processing gas into the processing chamber;

generating a plasma by applying a high frequency power to one of the first electrode and the second electrode; and applying a DC voltage to the first electrode and the second electrode.

Further, the DC voltage may be in a range approximately from −200 to −1500 V.

In accordance with another aspect of the present invention, there is provided a plasma etching method for plasma-etching an anti-reflective coating formed on a target object, including the steps of:

placing the target object into a processing chamber having a first electrode and a second electrode provided while facing each other, the target object including an etching target film, the anti-reflective coating and a patterned photoresist film sequentially formed in that order on a substrate;

introducing a processing gas into the processing chamber;

generating a plasma by applying a high frequency power to one of the first electrode and the second electrode; and applying a DC voltage to one of the first electrode and the second electrode, while the plasma is being generated such that a desired CD (critical dimension) distribution is obtained in a subsequent process of etching the underlying etching target film.

Further, the DC voltage may be in a range approximately from −200 to −1500 V. In addition, the plasma etching method may further include the step of obtaining, in advance, the DC voltage from a test object. In addition, the step of applying the DC voltage is performed by applying the DC voltage to one of the first and the second electrode.

In accordance with still another aspect of the present invention, there is provided a plasma etching method for plasma-etching an anti-reflective coating formed on a target object, including the steps of:

placing the target object into a processing chamber having a first electrode and a second electrode provided while facing each other, the target object including an etching target film, the anti-reflective coating and a patterned photoresist film sequentially formed in that order on a substrate;

introducing a processing gas into the processing chamber;

generating a plasma by applying a high frequency power to one of the first electrode and the second electrode and etching the anti-reflective coating by using the photoresist film as a mask; and applying a DC voltage to one of the first electrode and the second electrode such that an etched pattern dimension of the anti-reflective coating is smaller by a threshold value than a pattern dimension of the photoresist film.

In accordance with still another aspect of the present invention, there is provided a plasma etching method comprising the steps of:

placing a target object into a processing chamber having a first electrode and a second electrode provided while facing each other, the target object including an etching target film, an anti-reflective coating and a patterned photoresist film sequentially formed in that order on a substrate;

introducing a processing gas into the processing chamber;

generating a plasma to perform an etching process by applying a high frequency power to one of the first electrode and the second electrode;

applying a DC voltage to one of the first electrode and the second electrode during the etching process such that a pattern dimension of the anti-reflective coating is smaller by a threshold value than a pattern dimension of the photoresist film; and etching the etching target film into a pattern dimension smaller than the pattern dimension of the photoresist film by using the anti-reflective coating with an etching pattern smaller than the pattern dimension of the photoresist film as an etching mask.

Further, the DC voltage may be in a range approximately from −200 to −1500 V. In addition, the plasma etching method may further include the step of finding, in advance, the DC voltage from a test target object such that the pattern dimension of the anti-reflective coating is made equal to a desired dimension, wherein the DC voltage is applied to one of the first and the second electrode.

In accordance with still another aspect of the present invention, there is provided a computer-readable storage medium for storing a control program executed in a computer, wherein the control program is adapted to, when executed, enable the computer to control a plasma etching apparatus to perform any one of the plasma etching methods of the above.

In accordance with still another aspect of the present invention, there is provided a plasma etching apparatus for plasma-etching an anti-reflective coating formed on a target object, including:

a control unit for controlling the plasma etching apparatus to perform a plasma etching method, the plasma etching method including the steps of:

placing the target object into a processing chamber having a first electrode and a second electrode provided while facing each other, the target object including an etching target film, the anti-reflective coating and a patterned photoresist film sequentially formed in that order on a substrate;

introducing a processing gas into the processing chamber;

generating a plasma by applying a high frequency power to one of the first electrode and the second electrode; and applying a DC voltage to one of the first electrode and the second electrode, wherein the first electrode is an upper electrode and the second electrode is a lower electrode for supporting the target object, the high frequency power for plasma generation and the DC voltage being applied to the first electrode, and a high frequency power for ion attraction is applied to the second electrode; and a computer-readable storage medium for storing a control program executed in a computer, wherein the control program is adapted to, when executed, enable the computer to control a plasma etching apparatus to perform the plasma etching method.

In accordance with the present invention, when the anti-reflective coating is plasma-etched by supplying the high frequency power for plasma generation to the first electrode or the second electrode, it becomes possible to control the plasma through application of the direct current voltage to one of the first and second electrodes, whereby the etching process for the anti-reflective coating can be controlled by properly controlling the direct current voltage applied. This makes it possible to control the critical dimension distribution of the etching target film which is etched by using the anti-reflective coating as an etching mask. Thus, it is possible to reduce variations in the critical dimension of the etching target film that does matter in the prior art. Such controllability for the etching process of the anti-reflective coating also makes it possible to reduce in-plane variations of etching depth in the etching target film.

Moreover, if the anti-reflective coating is etched while applying the DC voltage to one of the first and second electrodes, it is possible to supply the target object with a polymer adhered to the electrode to which the direct current voltage is applied. Thus, by controlling the voltage applied, it is ensured that a pattern dimension of the anti-reflective coating becomes smaller by a given value than a pattern dimension of the photoresist film. This helps to realize the desired critical dimension shrinkage with no likelihood of reducing an etching uniformity and an etching rate.

BRIEF DESCRIPTION OF THE DRAWINGS

The above and other objects and features of the present invention will become apparent from the following description of preferred embodiments given in conjunction with the accompanying drawings, in which:

FIG. 6 presents plots showing in-plane distributions of etching rates of an anti-reflective coating for cases of different direct current voltages being applied;

DETAILED DESCRIPTION OF THE EMBODIMENTS

Hereinafter, embodiments of the present invention will be described in detail with reference to the accompanying drawings.

Figure 1:
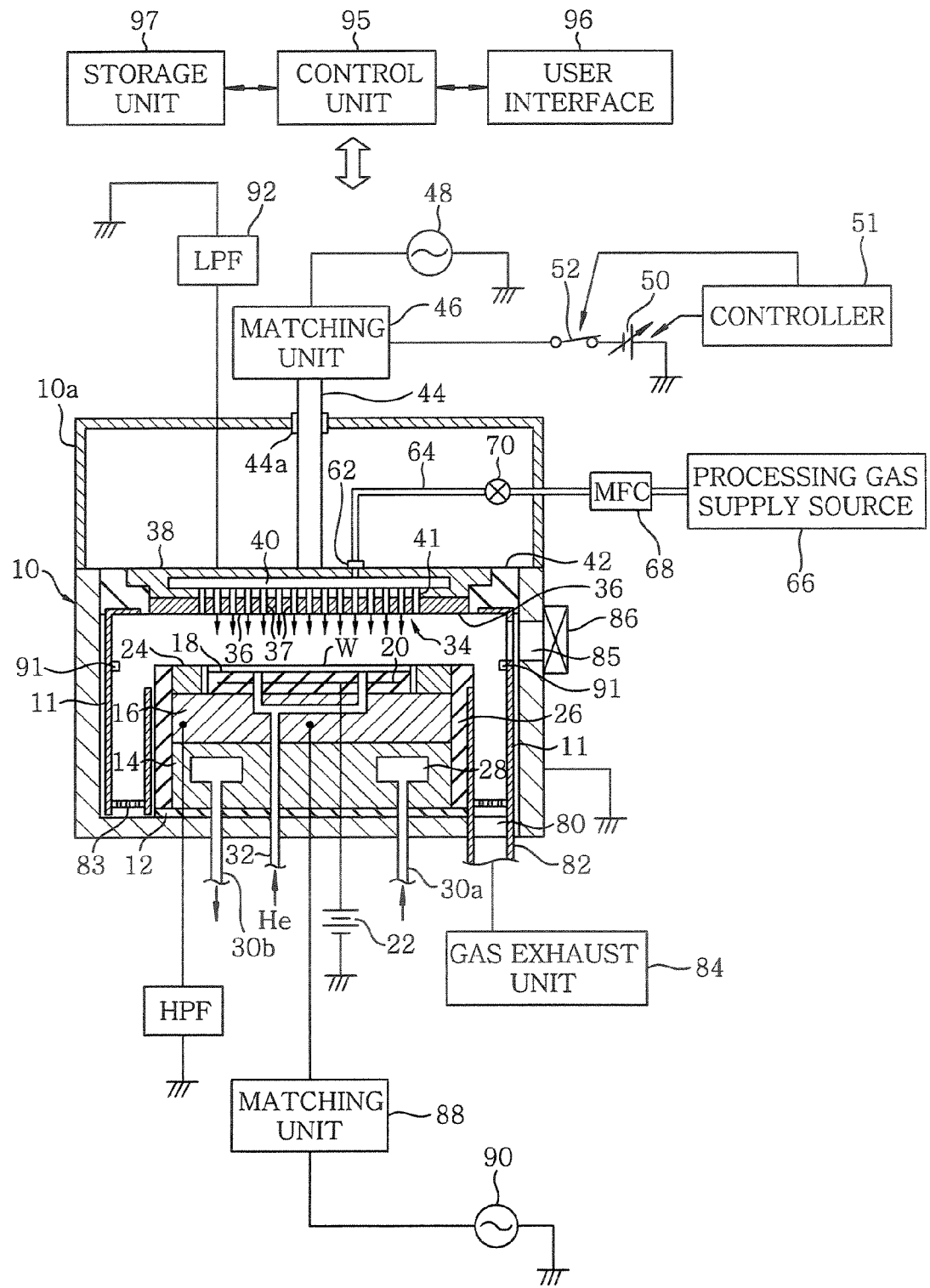
FIG. 1 is a schematic view showing one example of a plasma etching apparatus utilized in implementing the present invention.

FIG. 1 is a schematic view showing one example of a plasma etching apparatus utilized in implementing the present invention.

This plasma etching apparatus is a capacitance-coupled parallel plate type plasma etching apparatus and includes a generally cylindrical chamber (processing chamber) 10 made of, e.g., surface-anodized aluminum. The chamber 10 is a frame-grounded.

On a bottom portion of the chamber 10, there is arranged a cylindrical susceptor base 14 through an insulating plate 12 made of ceramics or other materials. A susceptor 16 made of, e.g., aluminum, is provided on the susceptor base 14, wherein the susceptor 16 is adapted to serve also as a lower electrode. A semiconductor wafer W serving as an object substrate is mounted on the susceptor (lower electrode) 16.

On a top surface of the susceptor 16, there is provided an electrostatic chuck 18 that attracts and holds the semiconductor wafer W with an electrostatic force. The electrostatic chuck 18 is of a structure having an electrode 20 made of a conductive film and interlaid between a pair of insulating layers or insulating sheets. A direct current power supply 22 is electrically connected to the electrode 20. The semiconductor wafer W is attracted to and held in place on the electrostatic chuck 18 by virtue of an electrostatic force, such as the Coulomb force, generated by a direct current voltage supplied from the direct current power supply 22.

On the top surface of the susceptor 16 around the electrostatic chuck 18 (or the semiconductor wafer W), there is arranged a focus ring (calibration ring) 24 that is made of, e.g., silicon, and serves to improve an etching uniformity. A cylindrical inner wall member 26 made of, e.g., quartz, is provided on the outer surface of the susceptor 16 and the susceptor base 14.

A coolant chamber 28 is formed within the susceptor base 14 to extend, e.g., annularly along a circumferential direction. Coolant, e.g., cooling water, of a predetermined temperature is supplied to the coolant chamber 28 from an external chiller unit (not shown) to be circulated therein through pipelines 30a and 30b. The temperature at which the semiconductor wafer W on the susceptor 16 is treated can be controlled based on the temperature of the coolant.

Furthermore, a heat-conductive gas, e.g., an He gas, is supplied from a heat-conductive gas supply mechanism (not shown) to a space formed between a top surface of the electrostatic chuck 18 and a back surface of the semiconductor wafer W through a gas supply line 32.

Above the lower electrode or susceptor 16, there is provided an upper electrode 34 in a parallel and mutually facing relationship with the susceptor 16. Thus, the space formed between the upper electrode 34 and the lower electrode 16 becomes a plasma generation space. The upper electrode 34 is adapted to face the semiconductor wafer W on the lower electrode or susceptor 16, thereby forming a surface contiguous to the plasma generation space, i.e., an opposing surface.

The upper electrode 34 is supported on an upper portion of the chamber 10 through an insulating shield member 42 and is constructed from an electrode plate 36 and a water-cooled electrode support body 38. The electrode plate 36 forms a surface facing the susceptor 16 and has a plurality of ejection ports 37. The electrode support body 38 is adapted to detachably support the electrode plate 36 and is made of a conductive material, e.g., surface-anodized aluminum. The electrode plate 36 is preferably formed of a conductive body with a small Joule heat and a low resistance or a semiconductor. From a standpoint of reinforcing a resist as set forth below, it is preferred that the electrode plate 36 be formed of a silicon-containing material. Thus, the electrode plate 36 is preferably made of silicon or SiC. Inside the electrode support body 38, there is provided a gas diffusion chamber 40 from which a multiple number of gas passage holes 41 extend in a downward direction to communicate with gas ejection ports 37.

The electrode support body 38 has a gas inlet port 62 through which a processing gas is led to the gas diffusion chamber 40. Connected to the gas inlet port 62 is a gas supply conduit 64 which in turn is associated with a processing gas supply source 66. A mass flow controller (MFC) 68 and a shutoff valve 70 are provided on the gas supply conduit 64 in the named sequence from the upstream side (an FCS (Flow Control System) may be used in place of the MFC). The processing gas for an etching operation, e.g., a fluorocarbon gas $(C_xF_y)$ such as a $CF_4$ gas, is supplied to the gas diffusion chamber 40 from the processing gas supply source 66 through the gas supply conduit 64 and then is ejected into the plasma generation space in the form of a shower through the gas passage holes 41 and the gas ejection ports 37. Namely, the upper electrode 34 serves to function also as a shower head for supplying the processing gas.

A first high-frequency power supply 48 is electrically connected to the upper electrode 34 via a matching unit 46 and a power supply rod 44. The first high-frequency power supply 48 is adapted to generate a high frequency power with a frequency of 10 MHz or higher, e.g., 60 MHz. The matching unit 46 serves to match a load impedance to an internal (output) impedance of the first high-frequency power supply 48 and functions to ensure that the apparent output impedance of the first high-frequency power supply 48 coincide with the apparent load impedance while plasma is being generated within the chamber 10. The matching unit 46 has an output terminal connected to a top end of the power supply rod 44.

In the meantime, a variable direct current power supply 50 as well as the first high-frequency power supply 48 is electrically connected to the upper electrode 34. The variable direct current power supply 50 may be a bipolar power supply. More specifically, the variable direct current power supply 50 is connected to the upper electrode 34 via the matching unit 46 and the power supply rod 44, and the power supply operation of the variable direct current power supply 50 is turned on or off by means of an on-off switch 52. A controller 51 is employed to control the polarity, current and voltage of the variable direct current power supply 50 and the on-off operation of the on-off switch 52.

Figure 2:
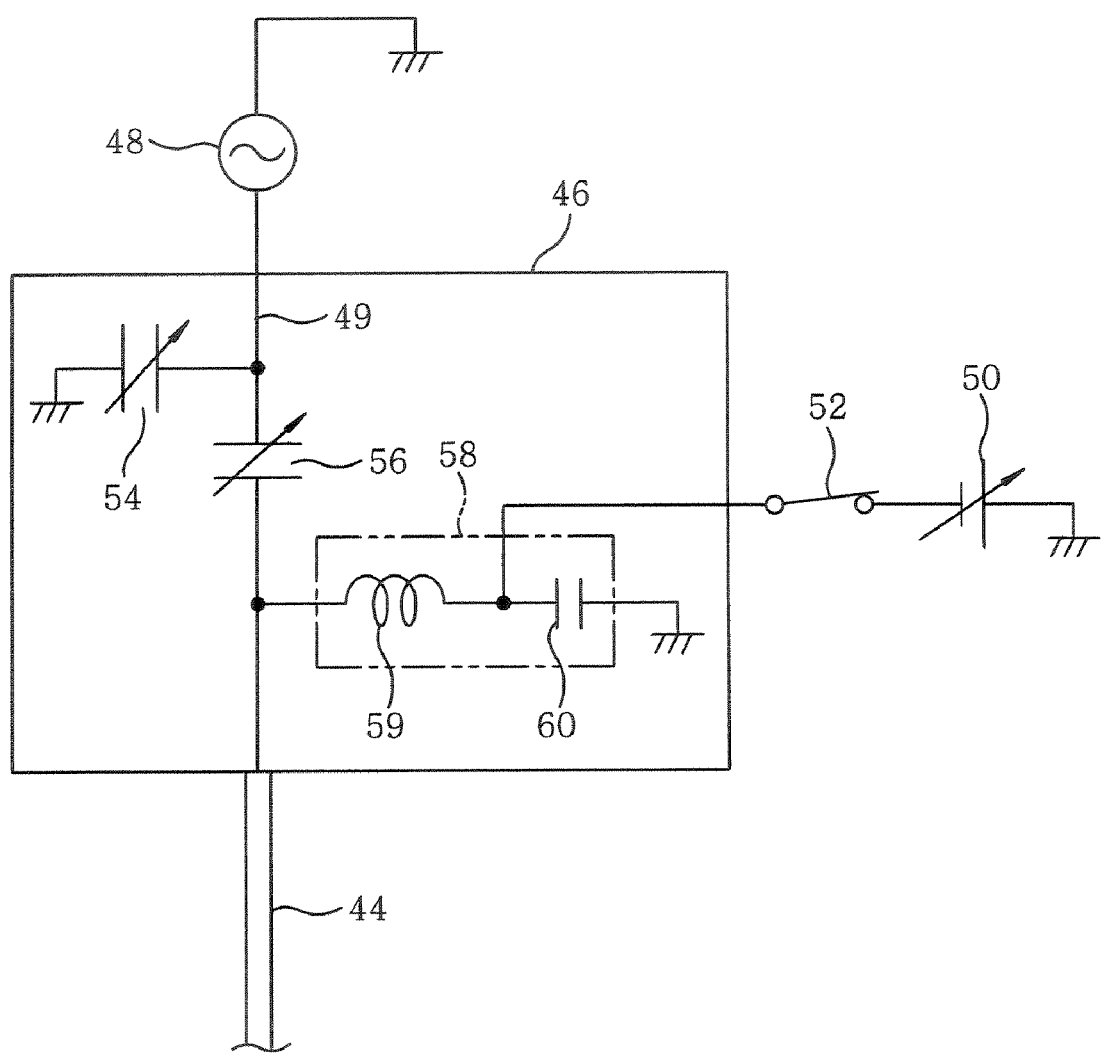
FIG. 2 shows a matching unit connected to a first high-frequency power supply in the plasma etching apparatus shown in FIG. 1.

Referring to FIG. 2, the matching unit 46 includes a first variable capacitor 54 branched from a power supply line 49 of the first high-frequency power supply 48 and a second variable capacitor 56 provided on the power supply line 49 downstream of the branching point of the first variable capacitor 54, both of which cooperate to perform the function noted above. In order to assure effective supply of an electric current of direct current voltage (hereinbelow simply referred to as "direct current voltage") to the upper electrode 34, the matching unit 46 further includes a filter 58 for trapping the high frequency (of, e.g., 60 MHz) from the first high-frequency power supply 48 and the high frequency (of, e.g., 2 MHz) from a below-mentioned second high-frequency power supply. In other words, a direct current is supplied from the variable direct current power supply 50 to the power supply line 49 via the filter 58. The filter 58 includes a coil 59 and a capacitor 60, both of which serve to trap the high frequency from the first high-frequency power supply 48 and the high frequency from the below-mentioned second high-frequency power supply.

A cylindrical grounding conductor 10a is provided to extend from the sidewall of the chamber 10 more upwardly than the elevation of the upper electrode 34. The cylindrical grounding conductor 10a has a ceiling wall portion electrically insulated from the power supply rod 44 by virtue of an insulating member 44a.

A second high-frequency power supply 90 is electrically connected to the lower electrode or susceptor 16 through a matching unit 88. As a high frequency power is supplied from the second high-frequency power supply 90 to the lower electrode or susceptor 16, ions are introduced toward the semiconductor wafer W. The second high-frequency power supply 90 is adapted to generate a high frequency power whose frequency is in the range between 300 kHz and 13.56 MHz, e.g., 2 MHz. The matching unit 88 serves to match a load impedance to an internal (output) impedance of the second high-frequency power supply 90 and functions to ensure that the output impedance of the second high-frequency power supply 90 coincides with the apparent load impedance while plasma is being generated within the chamber 10.

Electrically connected to the upper electrode 34 is a low-pass filter (LPF) 92 not allowing the high frequency (60 MHz) supplied from the first high-frequency power supply 48 from passing thereto while allowing the high frequency (2 MHz) supplied from the second high-frequency power supply 90 to pass to the ground. Although the low-pass filter 92 is preferably formed of an LR filter or an LC filter, use of a single conductor line may suffice because it would be able to apply a great enough reactance against the high frequency (60 MHz) supplied from the first high-frequency power supply 48. On the other hand, a high-pass filter (HPF) 94 for passing the high frequency (60 MHz) supplied from the first high-frequency power supply 48 to the ground is electrically connected to the lower electrode or susceptor 16.

An exhaust port 80 is provided on the bottom portion of the chamber 10 and a gas exhaust unit 84 is connected to the exhaust port 80 through an exhaust conduit 82. The gas exhaust unit 84 is provided with a vacuum pump such as a turbo molecular pump and is capable of depressurizing the inside of the chamber 10 to a desired level of vacuum. A gateway 85 through which the semiconductor wafer W is conveyed into or out of the chamber 10 is formed on the sidewall of the chamber 10. The gateway 85 is openably closed by means of a gate valve 86.

A deposition shield 11 for preventing etching byproducts (depositions) from adhering to the chamber 10 is detachably provided along an inner wall of the chamber 10. That is to say, the deposition shield 11 forms a chamber wall. Another deposition shield 11 is provided on an outer circumference of the inner wall member 26. An exhaust plate 83 is provided near the lower portion of the chamber 10 between the deposition shield 11 closer to the chamber wall and the deposition shield 11 closer to the inner wall member 26. The deposition shields 11 and the exhaust plate 83 are preferably made of an aluminum material coated with ceramics such as $Y_2O_3$.

A conductive member (GND block) 91 grounded in a DC-like manner is provided on a portion of the deposition shield 11 for forming the chamber wall substantially at the same elevation as that of the semiconductor wafer W. This provides an advantageous effect that an abnormal electric discharge can be avoided.

Individual component parts of the plasma etching apparatus are configured such that they can be connected to and controlled by a control unit (general control device) 95. Also connected to the control unit 95 is a user interface 96 that includes, among other things, a keyboard for enabling a process manager to input commands to thereby manage the plasma etching apparatus and a display for visually displaying operating status of the plasma etching apparatus.

Additionally connected to the control unit 95 is a storage unit 97 that stores a control program for performing various processes executed by the plasma etching apparatus under a control of the control unit 95 and a program, i.e., recipes, for making the individual component parts of the plasma etching apparatus perform their tasks in accordance with given process conditions. The recipes may be stored in a hard disk or a semiconductor memory or may be set into a predetermined position of the storage unit 97 in a state recorded on a portable and computer-readable storage medium such as a CD-ROM, a DVD or the like.

If necessary, an arbitrary recipe is retrieved from the storage unit 97 by a command inputted through the user interface 96 and is then executed by the control unit 95, thus ensuring that a desired process is performed in the plasma etching apparatus under a control of the control unit 95.

Next, description will be made on the plasma etching method in accordance with a first embodiment of the present invention, which is implemented by means of the plasma etching apparatus of the above configuration.

Figure 3:
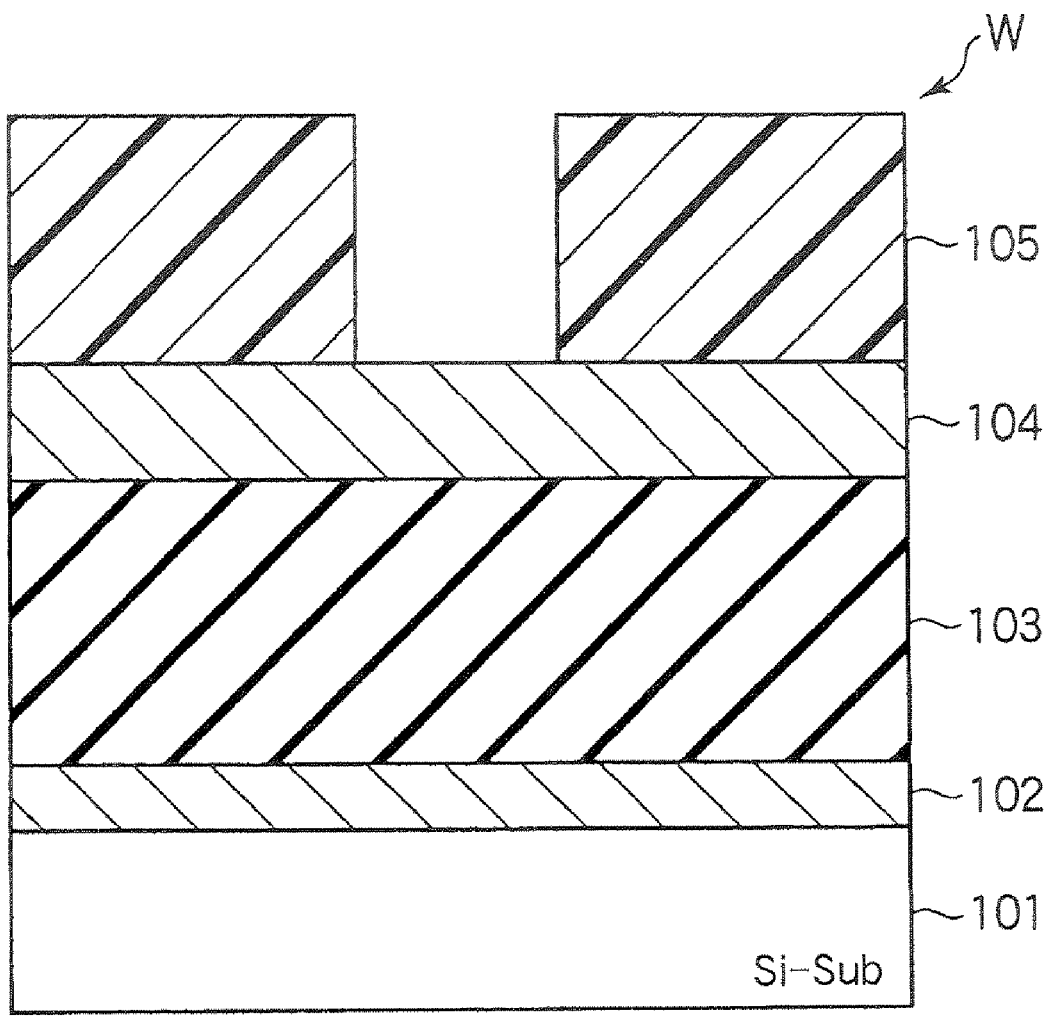
FIG. 3 is a sectional view illustrating a structure of a semiconductor wafer W used in implementing a first embodiment of the present invention.

In this regard, the semiconductor wafer W used as a target object is of the type including an etching stopper film 102, an etching target film 103, a bottom anti-reflective coating (BARC) 104 and a patterned photoresist film 105 sequentially formed on a Si substrate 101 one atop another as illustrated in FIG. 3.

An SiC film may be exemplified as the etching stopper film 102. The etching stopper film 102 has a thickness ranging from about 20 to 100 nm. An interlayer insulating film, e.g., a $SiO_2$ film and/or a low-k film, may be exemplified as the etching target film 103. The anti-reflective coating 104 predominantly includes an organic material and has a thickness ranging from about 20 to 100 nm. An ArF resist may be exemplified as the photoresist film 105. The photoresist film 105 has a thickness ranging from about 100 to 400 nm.

First of all, while the gate valve 86 is opened, the semiconductor wafer W of the structure stated above is conveyed into the chamber 10 through the gateway 85 to be mounted on the susceptor 16, wherein the gate valve 86 is closed thereafter. Then, the processing gas for etching the anti-reflective coating 104 is supplied to the gas diffusion chamber 40 from the processing gas supply source 66 at a predetermined flow rate. The processing gas is fed into the chamber 10 through the gas passage holes 41 and the gas ejection ports 37, while the chamber 10 is evacuated by means of the gas exhaust unit 84 so that the internal pressure of the chamber 10 can be made equal to a preset value ranging from, e.g., 0.1 to 150 Pa. The susceptor 16 is kept at a temperature of about 20° C.

In this connection, a variety of conventionally available gases may be employed as the processing gas for etching the anti-reflective coating 104, examples of which include a gas containing a fluorocarbon gas ($C_xF_y$) and a mixture gas of an $N_2$ gas and an $O_2$ gas. Typically, a $CF_4$ gas is used alone or in combination with an Ar gas, a He gas or the like. It is also possible to use a $C_4F_8$ gas independently or in combination with an $N_2$ gas or an $O_2$ gas.

Under the condition that the etching gas is introduced into the chamber 10 in this manner, the first high-frequency power supply 48 is made to apply a high frequency power for plasma generation to the upper electrode 34 at a predetermined intensity and, at the same time, the second high-frequency power supply 90 is made to apply a high frequency power for ion attraction to the lower electrode or susceptor 16 at a prescribed intensity. A given direct current voltage is applied to the upper electrode 34 by means of the variable direct current power supply 50. Furthermore, a direct current voltage for the electrostatic chuck 18 is applied to the electrode 20 of the electrostatic chuck 18 from the direct current power supply 22, thereby fixing the semiconductor wafer W to the susceptor 16.

The processing gas ejected through the gas ejection ports 37 of the electrode plate 36 of the upper electrode 34 is converted to a plasma in the midst of glow discharge generated between the upper electrode 34 and the lower electrode or susceptor 16 by the high frequency power. An object surface of the semiconductor wafer W is etched with radicals or ions generated by the plasma.

Inasmuch as an electric power of high frequency band (e.g., 10 MHz or more) is supplied to the upper electrode 34, it becomes possible to increase the density of the plasma in a desired state, which in turn makes it possible to form a high density plasma even under a lower pressure condition.

As the plasma is formed in this manner, the variable direct current power supply 50 applies a direct current voltage of given polarity and magnitude to the upper electrode 34. This helps to control an etching operation for the anti-reflective coating 104. At this time, the value of the direct current voltage is controlled to ensure that a desired in-plane critical dimension distribution is obtained in a subsequent etching process of the etching target film 103.

Figure 4:
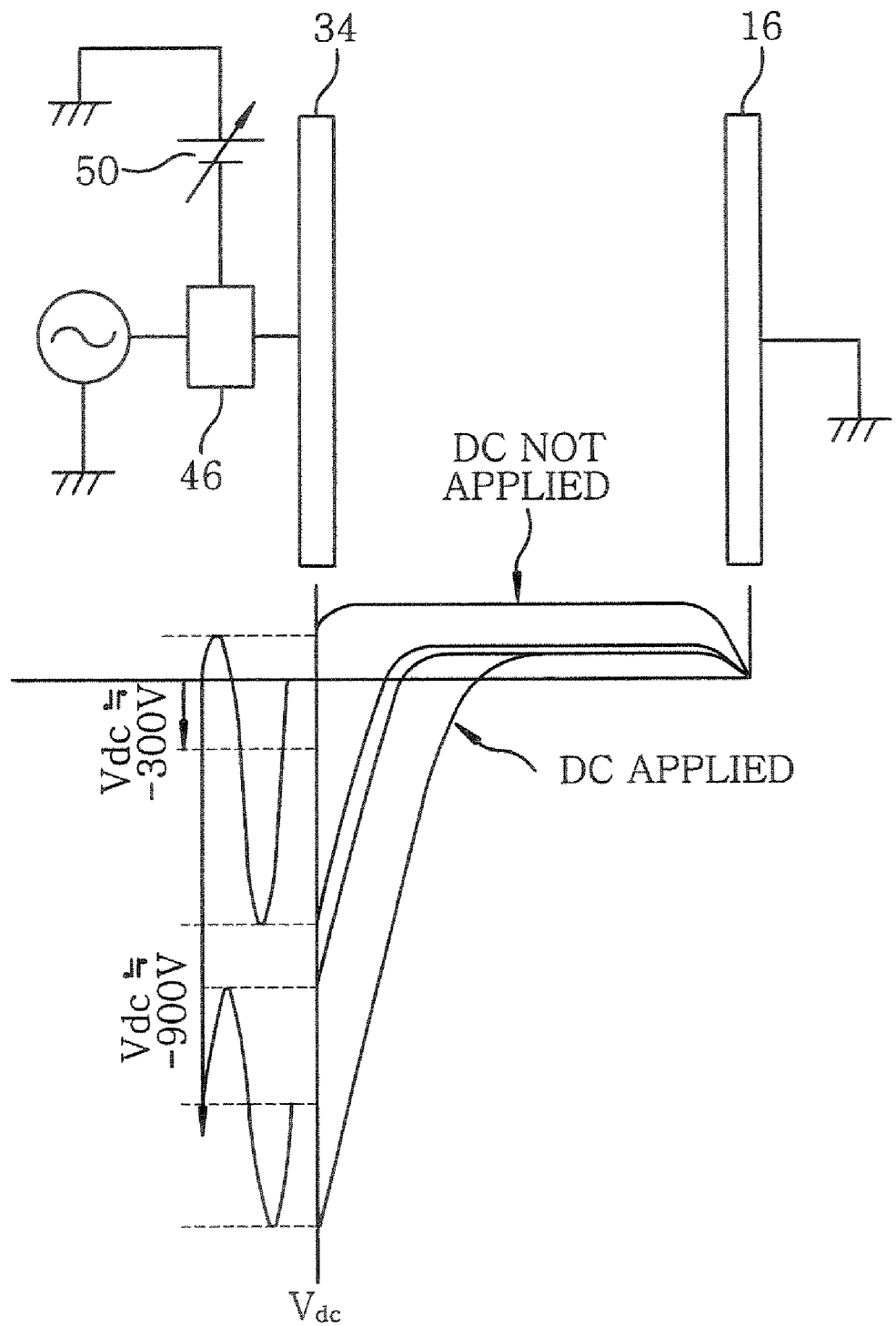
FIG. 4 is a view illustrating changes in $V_{dc}$ and thickness of a plasma sheath when a direct current voltage has been applied to an upper electrode in the plasma etching apparatus shown in FIG. 1.
Figure 5A:
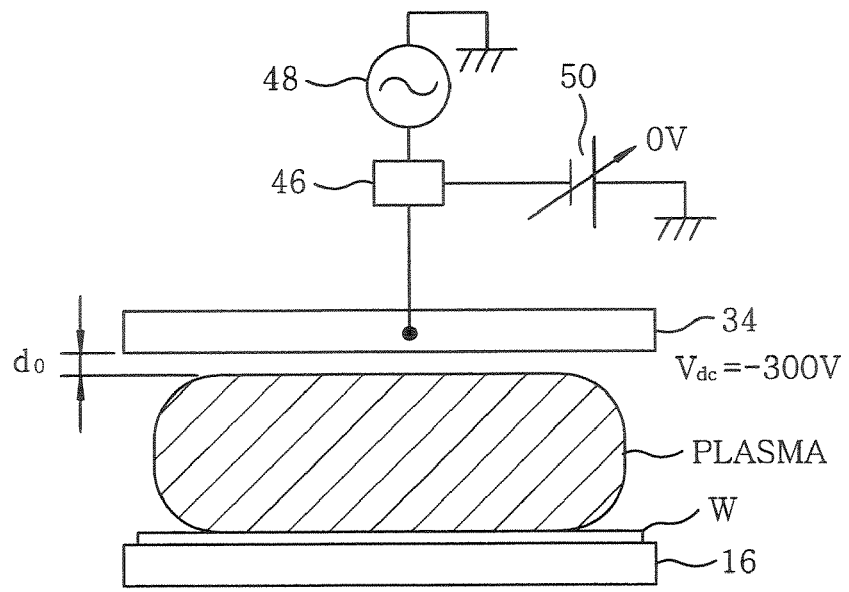
FIGS. 5A and 5B are comparative plots respectively representing plasma states in case when the direct current voltage is applied to the upper electrode and in case when no direct current voltage is applied thereto in the plasma etching apparatus shown in FIG. 1.

More specifically, if the direct current voltage is applied to the upper electrode 34, the plasma sheath formed on the side near to the upper electrode 34 grows in thickness as illustrated in FIG. 4. The plasma is shrunken in proportion to the increase in the thickness of the plasma sheath. For instance, in case when no direct current voltage is applied to the upper electrode 34, the $V_{dc}$ on the side of the upper electrode 34 is equal to, e.g., −300 V, and the plasma has a small sheath thickness $d_o$ as depicted in FIG. 5A. If a direct current voltage of −900 V is applied to the upper electrode 34, the $V_{dc}$ on the side of the upper electrode 34 is made equal to, e.g., −900 V, and the plasma has a sheath thickness proportionate to three quarters of an absolute value of the $V_{dc}$.

Figure 5B:
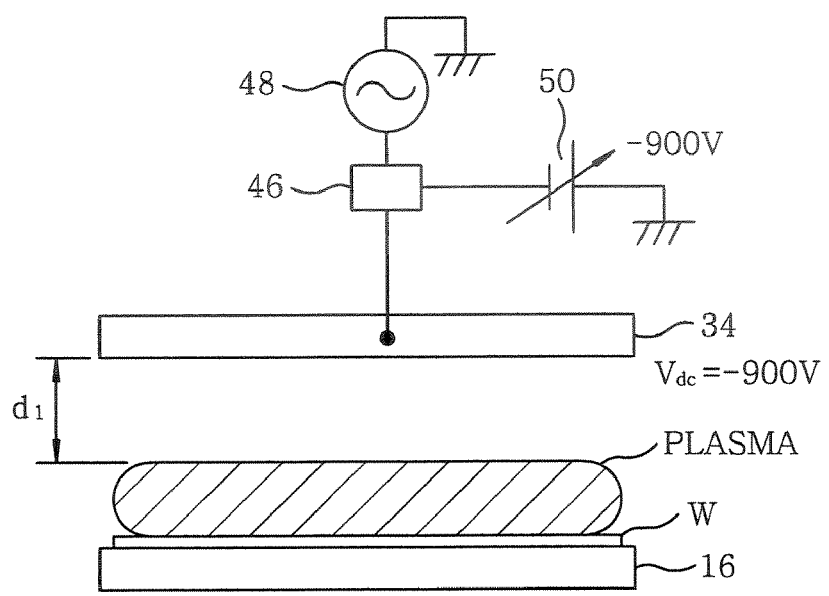

Thus, as depicted in FIG. 5B, there is formed a plasma sheath having an increased thickness $d_1$ and the plasma is shrunken in proportion thereto. The degree of shrinkage at this time varies with the intensity of the direct current voltage applied. In other words, the plasma distribution can be controlled by controlling the direct current voltage applied. This helps to control an etching operation of the anti-reflective coating 104.

The etching target film 103 is etched by using the anti-reflective coating 104 thus etched and the photoresist film 105 as a mask. This means that the critical dimension distribution of the etching target film 103 can be controlled by controlling the etching operation of the anti-reflective coating 104 through the application of the direct current voltage.

Namely, for the purpose of obtaining a desired critical dimension distribution (CD uniformity) in a subsequent etching process of the etching target film 103, the etching operation for the anti-reflective coating 104 is performed while allowing the variable direct current power supply 50 to apply a given direct current voltage to the upper electrode 34. This makes it possible to suppress occurrence of a variation in critical dimension of the etching target film 103. By performing the etching operation in this manner, it is also possible to suppress occurrence of a variation in etching thickness, which would be caused in the process of etching the etching target film 103. In this case, the direct current voltage applied to the upper electrode 34 is preferably made to range from about −200 V to about −1500 V.

After the anti-reflective coating 104 has been etched in the manner noted above, the etching target film 103 is etched by using the photoresist film 105 and the anti-reflective coating 104 as a mask, at which time the etching conditions such as a kind, a flow rate, a pressure and a temperature of the processing gas are not particularly limited but may be selected same as the conventionally available ones.

When performing the plasma etching method of the present embodiment, the first task is to etch a test semiconductor wafer under given conditions by use of the plasma etching apparatus shown in FIG. 1. Thereafter, the semiconductor wafer is conveyed out of the plasma etching apparatus and is inspected by means of an inspection apparatus to thereby find, in advance, a direct current voltage value by which a desired critical dimension distribution (a desired in-plane uniformity of critical dimension) can be obtained in a subsequent process of etching the underlying etching target film. If an etching operation is carried out while applying a direct current voltage of the value thus found to the upper electrode, it is possible to rapidly perform the etching treatment under appropriate conditions. As the test semiconductor wafer noted above, a first single sheet or first two or more sheets of wafer in a particular wafer lot can be used.

Figure 7:
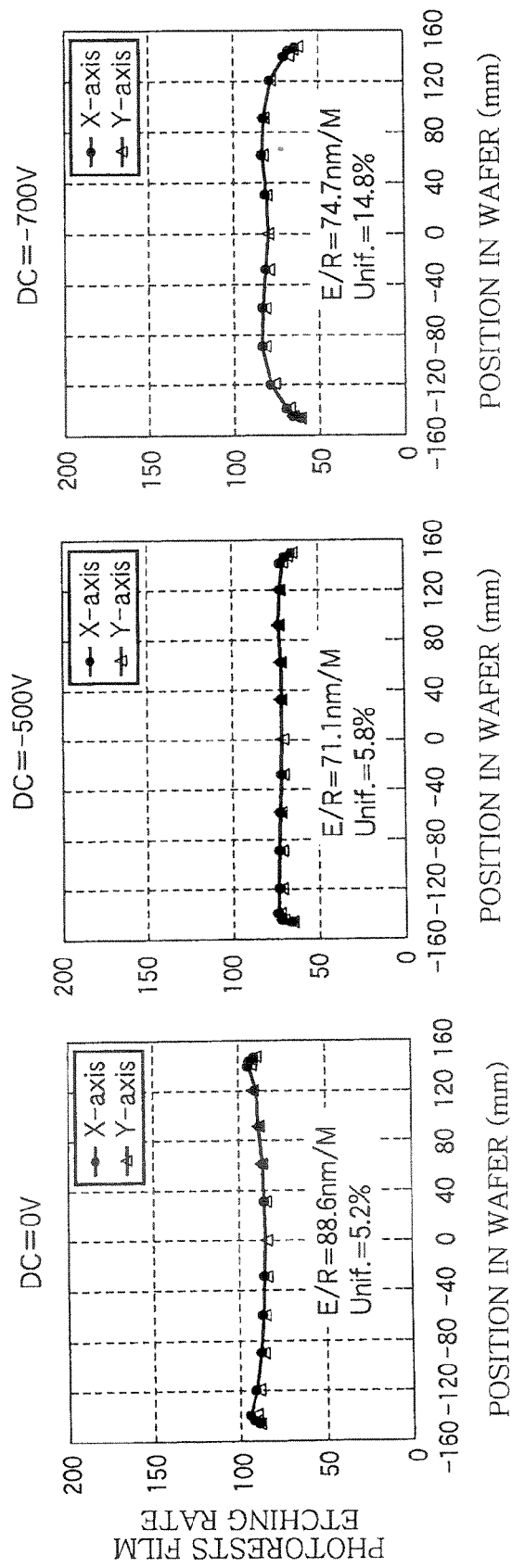
FIG. 7 presents plots showing in-plane distributions of etching rates of a photoresist film respectively corresponding to different direct current voltages applied.
Figure 8:
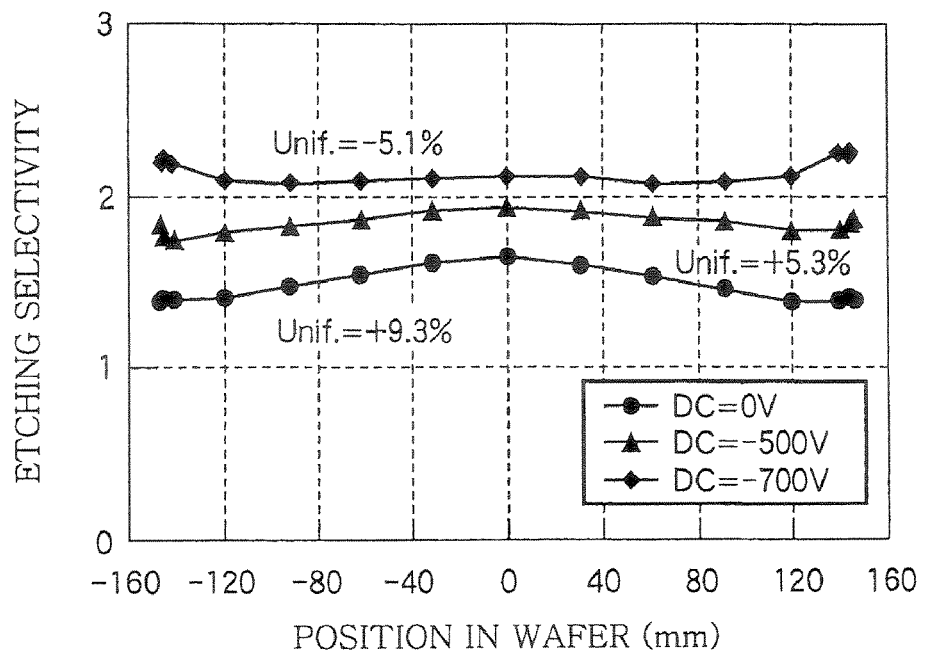
FIG. 8 depicts graphs showing in-plane distributions of etching selectivity ratios of the anti-reflective coating to the photoresist film corresponding to the instances shown in FIGS. 6 and 7.

Next, description will be given to the result of confirmation of the advantageous effects provided by the plasma etching method of the first embodiment. In this regard, an organic anti-reflective film was used as the anti-reflective coating and an ArF resist was employed as the photoresist film. These blanket films were etched by using the plasma etching apparatus shown in FIG. 1. Under the process conditions including a pressure of 13.3 Pa (100 mT), an upper high-frequency power of 500 W, a lower high-frequency power of 400 W, a flow rate of a $CF_4$ process gas of 150 mL/min (standard state equivalent-sccm) and a susceptor temperature of 20° C., the etching was performed for 60 seconds by applying three kinds of direct current voltages, i.e., 0V, −500 V and −700 V, to the upper electrode 34. FIG. 6 shows in-plane distributions of etching rates of the anti-reflective coating at that time. Further, FIG. 7 represents in-plane distributions of etching rates of the photoresist film at that time. FIG. 8 illustrates in-plane distributions of etching selectivity of the anti-reflective coating against the photoresist film in those instances.

It can be seen in these figures that the etching characteristic distributions of the anti-reflective coating are changed by varying the direct current voltage applied to the upper electrode 34. In case of this example, it can be noted that the etching uniformity is improved at a direct current voltage of −500 V and the in-plane uniformity of etching selectivity shows a greatest increase at a direct current voltage of −700 V. In the process of etching the underlying etching target film, the photoresist film and the anti-reflective coating thus etched were used as a mask. This means that, by controlling the etching characteristic distribution of the anti-reflective coating in this manner, it is possible to control the critical dimension distribution at the time of etching the etching target film and, eventually, to increase the in-plane uniformity of critical dimension.

Figure 9:
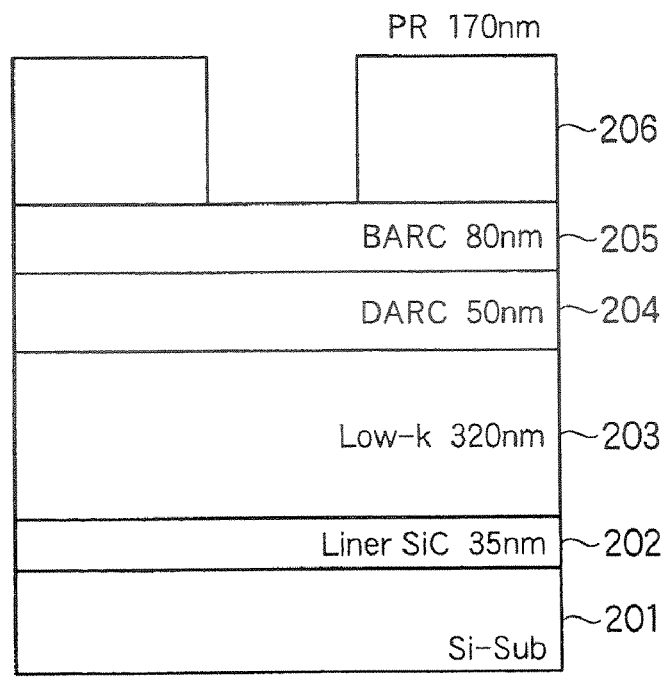
FIG. 9 is a view depicting a structure of a semiconductor wafer used in confirming advantageous effects offered by a first embodiment of the present invention.

Next, description will be made on the experiment conducted to confirm the above result. With respect to a semiconductor wafer of the structure including a liner SiC film 202 (with a thickness of 35 nm), a low-k film 203 (with a thickness of 320 nm), a dielectric anti-reflective coating (DARC) 204 (with a thickness of 50 nm), a bottom anti-reflective coating (BARC) 205 (with a thickness of 80 nm) and a patterned photoresist film (PR) 206 (with a thickness of 170 nm) respectively formed on a Si substrate 201 one atop another as illustrated in FIG. 9, the BARC 205 was first etched with the plasma etching apparatus shown in FIG. 1 by using the photoresist film 206 as a mask. Then, the DARC 204 and the low-k film 203, which were etching target films, were etched by using the photoresist film 206 and the BARC 205 as a mask.

The process conditions in etching the BARC 205 included a pressure of 13.3 Pa (100 mT), an upper high-frequency power of 500 W, a lower high-frequency power of 400 W, a flow rate of a $CF_4$ process gas of 150 mL/min (standard state equivalent-sccm) and a susceptor temperature of 20° C. The direct current voltage applied to the upper electrode was changed to 0 V and −500 V and the etching treatment was performed for 43 seconds.

The process conditions in etching the DARC 204 and the low-k film 203 included a pressure of 3.3 Pa (25 mT), an upper high-frequency power of 400 W, a lower high-frequency power of 1000 W, and flow rates of $C_4F_8$, $CH_2F_2$, CO and $N_2$ process gases of 8, 20, 30 and 230 mL/min (standard state equivalent-sccm). The etching treatments were performed for 30 seconds without applying a direct current voltage.

In performing the respective etching treatments, the temperatures of the lower electrode, the upper electrode and the wafer were set to 20, 60 and 60° C., respectively, and the introduction pressures of a He gas at the center and the edge were set to 2000 Pa and 6000 Pa, respectively.

The cross section and plane surface at the center and the edge were observed both for the instance without applying a direct current voltage and the instance with applying a direct current voltage of −500 V in the process of etching the BARC 205. The observation has revealed that the difference in top critical dimensions at the center and the edge is smaller in the instance with a direct current voltage of −500 V being applied than in the instance without a direct current voltage being applied during the etching process of the BARC 205. In more detail, the critical dimensions at the center and at a direct current voltage being applied, whereas the critical dimensions at the center and at the edge were 63 nm and 63 nm respectively in the instance with a direct current voltage of −500 V being applied. This confirms that the critical dimension uniformity is increased in case when the direct current voltage is applied to the upper electrode. It has also been confirmed that application of the direct current voltage helps to eliminate variations in etching depth.

Next, description will be made on the plasma etching method in accordance with a second embodiment of the present invention, which is implemented by means of the plasma etching apparatus set forth above.

In this regard, the semiconductor wafer W shown in FIG. 3 and utilized in the first embodiment is used as a target object.

First of all, while the gate valve 86 is opened, the semiconductor wafer W of the structure stated above is conveyed into the chamber 10 through the gateway 85 and is mounted on the susceptor 16 as in the first embodiment, wherein the gate valve 86 is closed thereafter. Then, the processing gas for etching the anti-reflective coating 104 is supplied to the gas diffusion chamber 40 from the processing gas supply source 66 at a predetermined flow rate. The processing gas is fed into the chamber 10 through the gas passage holes 41 and the gas ejection ports 37, during which time the chamber 10 is evacuated by means of the gas exhaust unit 84 so that the internal pressure of the chamber 10 can be equal to a preset value ranging from, e.g., 0.1 to 150 Pa. The susceptor 16 is kept at a temperature of about 20° C.

Herein, the same gases used in the first embodiment can be advantageously utilized as the processing gas for etching the anti-reflective coating 104; but it may also be possible to use a variety of conventionally available gases for that purpose.

Under the condition that the etching gas is introduced into the chamber 10 in this manner, the first high-frequency power supply 48 is made to apply a high frequency power for plasma generation to the upper electrode 34 at a predetermined strength and, at the same time, the second high-frequency power supply 90 is made to apply a high frequency power for ion attraction to the lower electrode or susceptor 16 at a prescribed strength. A given direct current voltage is applied to the upper electrode 34 by means of the variable direct current power supply 50. Furthermore, a direct current voltage for energizing the electrostatic chuck 18 is applied to the electrode 20 of the electrostatic chuck 18 from the direct current power supply 22, thereby fixing the semiconductor wafer W to the susceptor 16.

The processing gas ejected through the gas ejection ports 37 of the electrode plate 36 of the upper electrode 34 is converted to a plasma in the midst of glow discharge generated between the upper electrode 34 and the lower electrode or susceptor 16 by the high frequency power. An object surface of the semiconductor wafer W is etched with radicals or ions generated by the plasma.

Inasmuch as an electric power of high frequency band (e.g., 10 MHz or more) is supplied to the upper electrode 34, it becomes possible to increase the density of the plasma in a desired state, which in turn makes it possible to form a high density plasma even under a lower pressure condition.

As the plasma is formed in this manner, the variable direct current power supply 50 applies a direct current voltage of given polarity and magnitude to the upper electrode 34. In the present embodiment, this helps to ensure that a pattern dimension of the anti-reflective coating 104 becomes smaller by a given value than a pattern dimension of the photoresist film 105. In other words, the critical dimension of the anti-reflective coating 104 can be shrunken in comparison with that of the photoresist film 105.

More specifically, in case of a typical etching process and particularly in an etching process wherein a high frequency power applied to the upper electrode 34 is weak, the upper electrode 34 comes into a state that a polymer is apt to adhere thereto. If a direct current voltage is applied to the upper electrode 34 with the polymer adhered to the latter, the polymer can be sputtered and supplied to the semiconductor wafer W, i.e., the target object. In other words, by supplying the polymer in the process of etching the anti-reflective coating 104, it is possible to attach the polymer to the sidewall of an etched portion and hence to shrink the critical dimension.

At this time, the polymer supply quantity can be controlled by controlling the direct current voltage applied to the upper electrode 34. This means that, by controlling the direct current voltage, it is possible to attach a desired amount of polymer to the etched portion to thereby control a shrinkage amount of the critical dimension. From this standpoint, the direct current voltage applied to the upper electrode 34 is preferably ranging from −200 to −1500V.

After the anti-reflective coating 104 has been etched in the manner noted above, the etching target film 103 is etched in the afore-mentioned manner by using the photoresist film 105 and the anti-reflective coating 104 as a mask, at which time the etching conditions such as a kind, a flow rate, a pressure and a temperature of the processing gas are not particularly limited but may be chosen to be same as the conventionally available ones. Thanks to the fact that the critical dimension of the anti-reflective coating 104 serving as an etching mask is shrunken in the etching process, it is possible to perform the etching operation in such a manner as to assure yielding a smaller critical dimension than is available by the photolithography.

When performing the plasma etching method of the present embodiment, the first task is to etch a test-purpose semiconductor wafer under given conditions by use of the plasma etching apparatus shown in FIG. 1. Thereafter, the semiconductor wafer is conveyed out of the plasma etching apparatus and is inspected by means of an inspection apparatus to thereby find, in advance, a direct current voltage value by which desired critical dimension shrinkage can be obtained. If an etching operation is carried out while applying a direct current voltage of the value thus found to the upper electrode, it is possible to rapidly perform the etching treatment under appropriate conditions. As the test-purpose semiconductor wafer noted above, use may be made of a first single sheet or first two or more sheets of wafer in a particular wafer lot.

Figure 10:
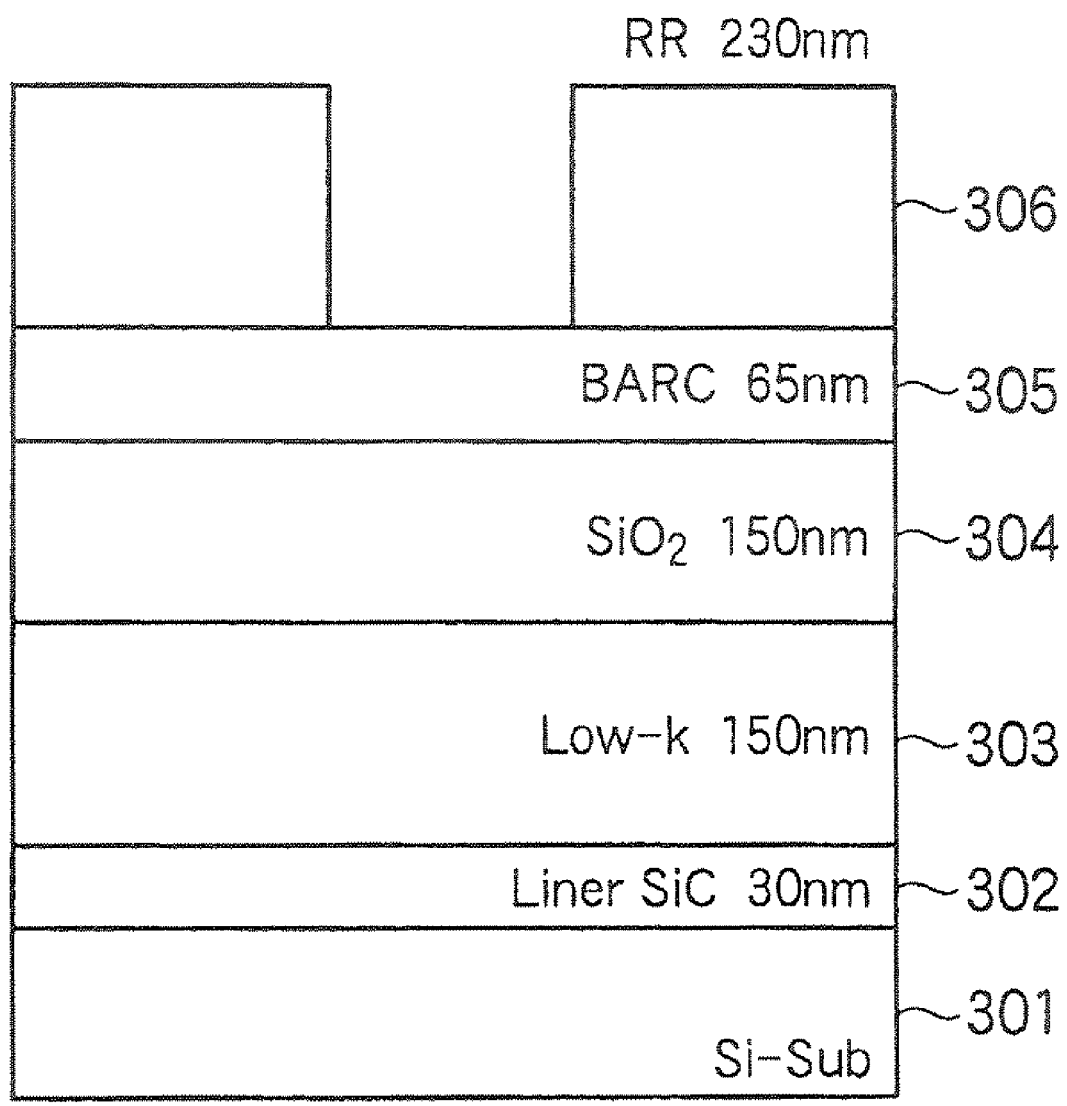
FIG. 10 is a view depicting a structure of a semiconductor wafer W used in confirming advantageous effects offered by a second embodiment of the present invention.

Next, description will be given to the result of confirmation of the advantageous effects provided by the plasma etching method of the second embodiment. With respect to a semiconductor wafer of the structure including a liner SiC film 302 (with a thickness of 30 nm), a low-k film 303 (with a thickness of 150 nm), a $SiO_2$ film 304 (with a thickness of 150 nm), an anti-reflective coating (BARC) 305 (with a thickness of 65 nm) and a patterned photoresist film (PR) 306 (with a thickness of 230 nm) respectively formed on a Si substrate 301 one atop another as shown in FIG. 10, the BARC 305 was first etched with the plasma etching apparatus shown in FIG. 1 by using the PR 306 as a mask. Then, the $SiO_2$ film 304 and the low-k film 303, which were etching target films, were etched by using the PR 306 and the BARC 305 as a mask.

The process conditions in etching the BARC 305 included a pressure of 20.0 Pa (150 mT), an upper high-frequency power of 400 W, a lower high-frequency power of 400 W and a flow rate of a $CF_4$ process gas of 200 mL/min (standard state equivalent-sccm). The direct current voltage applied to the upper electrode was changed to 0 V and −500 V and the etching treatment was performed for 50 seconds.

The process conditions in etching the $SiO_2$ film 304 included a pressure of 6.7 Pa (50 mT), an upper high-frequency power of 300 W, a lower high-frequency power of 600 W and flow rates of $CF_4$, $CHF_3$ and Ar process gases of 30, 15 and 1000 mL/min (standard state equivalent-sccm). The etching treatment was performed for 90 seconds without applying a direct current voltage.

The process conditions in etching the low-k film 303 included a pressure of 6.7 Pa (50 mT), an upper high-frequency power of 1000 W, a lower high-frequency power of 600 W and flow rates of $CF_4$, Ar and $N_2$ process gases of 30, 1000 and 40 mL/min (standard state equivalent-sccm). The etching treatment was performed for 20 seconds without applying a direct current voltage.

In performing the respective etching treatments, the temperatures of the lower electrode, the upper electrode and the wafer were set to 20, 60 and 60° C., respectively, and the introduction pressures of a He gas at the center and the edge were set to 2000 Pa and 6000 Pa, respectively. Moreover, the gap between the upper and lower electrodes was made equal to 35 mm.

The cross section at the center and at the edge and ashed surface were observed both the instance without applying a direct current voltage and the instance with a direct current voltage of −500 V being applied in the process of etching the BARC 305. The observation has revealed that, as compared to the instance where no direct current voltage was applied, the residual resist amount at the center was increased from 145 nm to 159 nm and that at the edge was increased from 113 nm to 151 nm in the instance where the direct current voltage of −500 V was applied during the etching process of the BARC 305. At the time when the photoresist film 306 and the anti-reflective coating 305 were removed by ashing, the top CD and the bottom CD were, respectively, 117 nm and 107 nm at the center and 115 nm and 102 nm at the edge in the instance where no direct current voltage were applied. The top CD and the bottom CD were, respectively, 97 nm and 85 nm at the center and 95 nm and 79 nm at the edge in the instance of application of a direct current voltage of −500 V, meaning that the CD was shrunken by about 20 nm.

It has been confirmed from the foregoing that the critical dimension can be shrunken to a great extent by applying a direct current voltage in the process of etching the anti-reflective coating 305. Further, it has been confirmed that, by applying a direct current voltage, a polymer is supplied to thereby reinforcing the photoresist, increasing the residual resist amount and also suppressing the striation.

The present invention is not limited to the foregoing embodiments and may be modified in many different ways. For example, although the low-k film and the $SiO_2$ film were illustrated as the etching target film in the foregoing embodiments, the present invention is not limited thereto.

Figure 11:
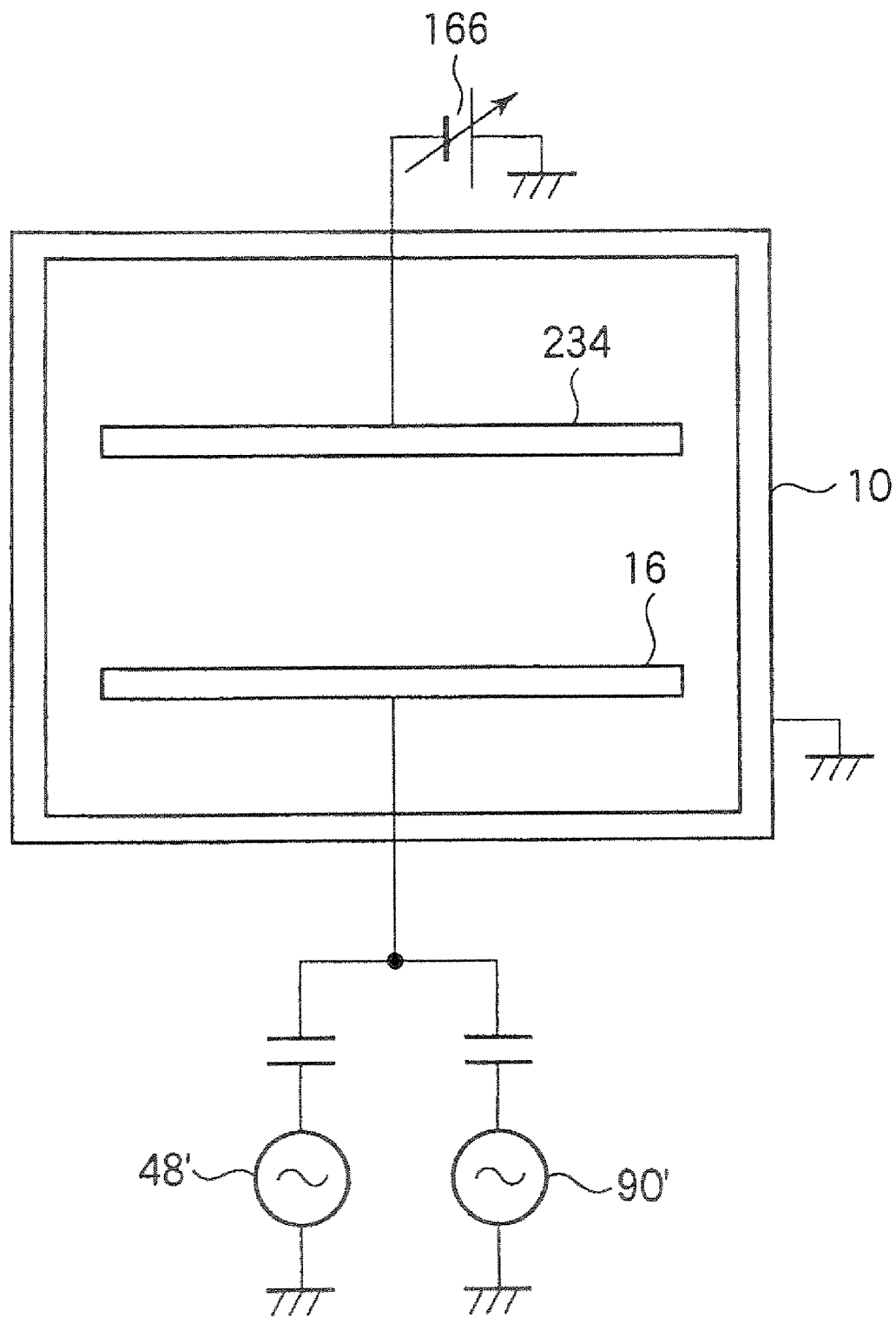
FIG. 11 is a schematic view showing another example of a plasma etching apparatus that can be employed in implementing the present invention.

Furthermore, the apparatus for implementing the present invention is not limited to the one shown in FIG. 1. Alternatively, it may be possible to use a variety of other apparatuses as set forth below. For instance, it is possible to employ a plasma etching apparatus of the type applying two kinds of frequencies to a lower electrode as shown in FIG. 11, in which a high frequency power of, e.g., 60 MHz, for plasma generation is applied to the lower electrode from a first high-frequency power supply 48' and a high frequency power of, e.g., 2 MHz, for ion attraction is applied to the lower electrode from a second high-frequency power supply 90'. The same advantageous effects as in the foregoing embodiments can be obtained by connecting a variable direct current power supply 166 to an upper electrode 234 and applying a given direct current voltage thereto as illustrated in FIG. 11.

Figure 12:
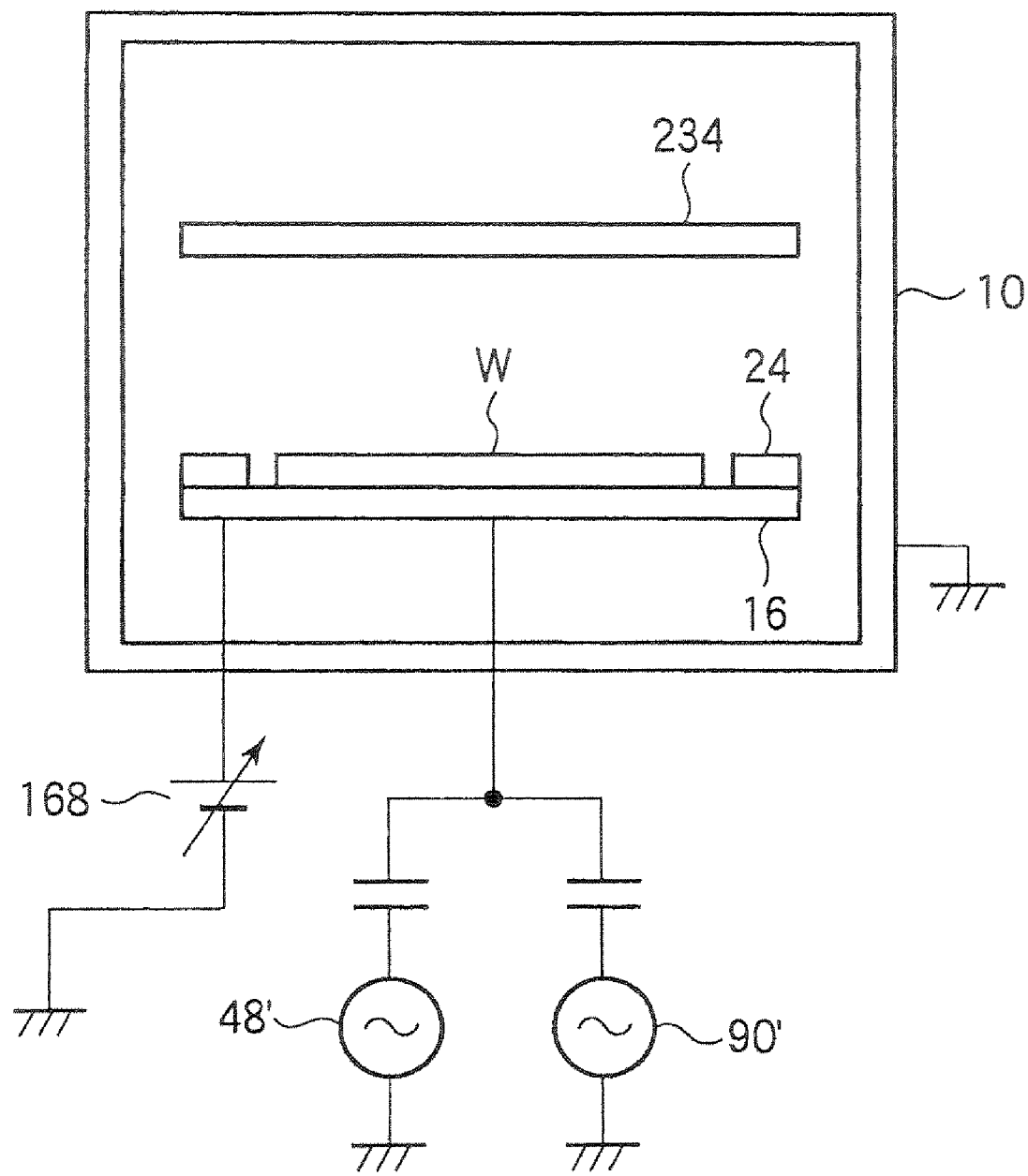
FIG. 12 is a schematic view showing a further example of a plasma etching apparatus that can be employed in implementing the present invention.

In this case, it may be possible that, as shown in FIG. 12, a direct current power supply 168 is connected to the lower electrode or susceptor 16 to thereby apply a direct current voltage to the susceptor 16.

Figure 13:
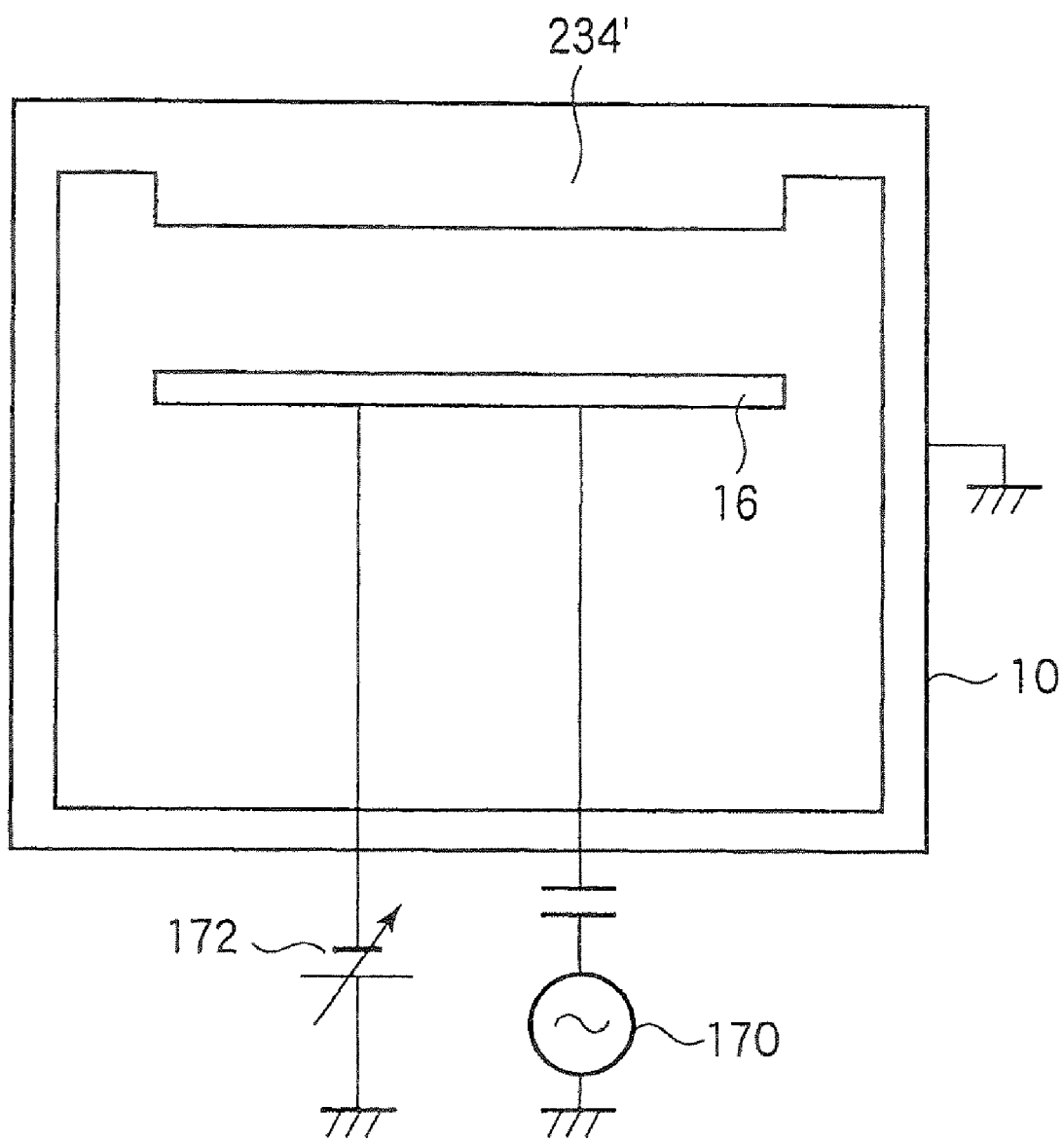
FIG. 13 is a schematic view showing a still further example of a plasma etching apparatus that can be employed in implementing the present invention.

Moreover, it is possible to employ a plasma etching apparatus of the type as shown in FIG. 13, wherein an upper electrode 234' is grounded via the chamber 10 and a high-frequency power supply 170 is connected to the lower electrode or susceptor 16 so that the high-frequency power supply 170 can apply a high frequency power of, e.g., 13.56 MHz, for plasma generation. In this case, the same advantageous effects as in the foregoing embodiments can be obtained by connecting a variable direct current power supply 172 to the lower electrode or susceptor 16 and applying a given direct current voltage thereto as illustrated in FIG. 13.

Figure 14:
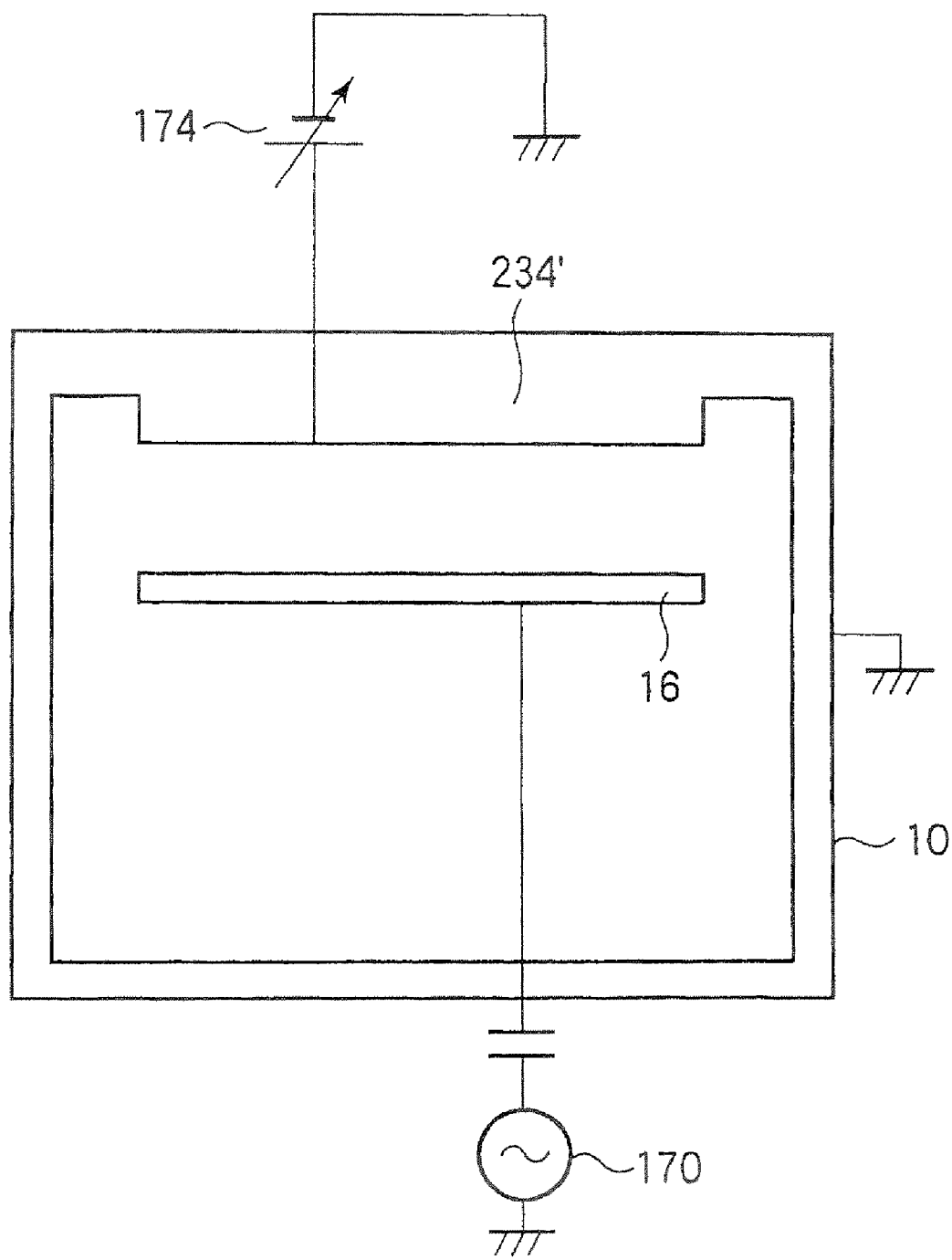
FIG. 14 is a schematic view showing a yet still further example of a plasma etching apparatus that can be employed in implementing the present invention.

Alternatively, as illustrated in FIG. 14, a variable direct current power supply 174 may be connected to the upper electrode 234' in the same plasma etching apparatus as shown in FIG. 13, wherein the upper electrode 234' is grounded via the chamber 10 and the high-frequency power supply 170 is connected to the lower electrode or susceptor 16 so that the high-frequency power supply 170 can apply a high frequency power for plasma generation.

While the invention has been shown and described with respect to the embodiments, it will be understood by those skilled in the art that various changes and modifications may be made without departing from the scope of the invention as defined in the following claims.

What is claimed is:

1. A plasma etching method for plasma-etching an anti-reflective coating formed on a target object, comprising the steps of:
    placing the target object into a processing chamber including a first electrode and a second electrode facing each other, the second electrode being provided with an electrostatic chuck and the target object being disposed on the electrostatic chuck, wherein the target object includes an etching target film, the anti-reflective coating and a patterned photoresist film sequentially formed in that order on a substrate;
    applying a first DC voltage to the electrostatic chuck to electrostatically absorb the target object thereto;
    introducing a processing gas into the processing chamber;
    generating a plasma by applying a high frequency power to one of the first electrode and the second electrode and etching the anti-reflective coating by using the patterned photoresist film as a mask; and
    applying a second DC voltage to one of the first electrode and the second electrode while etching the anti-reflective coating such that an etched pattern dimension of the etched anti-reflective coating is smaller by a predetermined value than a pattern dimension of the patterned photoresist film, wherein
    the second DC voltage is applied to the first electrode to sputter a polymer adhered to the first electrode while etching the anti-reflective coating so that the sputtered polymer is attached to a sidewall of an etched portion of the anti-reflective coating.

2. The plasma etching method of claim 1, wherein the second DC voltage is applied to the first electrode and is in a range approximately from −200 V to −1500 V.

3. The plasma etching method of claim 1, wherein a residual amount of the patterned photoresist film is increased when the second DC voltage is applied to the first electrode.

4. The plasma etching method of claim 1, wherein the second DC voltage has a negative value when applied to the first electrode and a positive value when applied to the second electrode.

5. The plasma etching method of claim 1, wherein a width of an opening of the etched anti-reflective coating is smaller by the predetermined value than a width of a corresponding opening of the patterned photoresist film.

6. A plasma etching method comprising the steps of:
    placing a target object into a processing chamber including a first electrode and a second electrode provided while facing each other, the second electrode being provided with an electrostatic chuck and the target object being disposed on the electrostatic chuck, wherein the target object includes an etching target film, an anti-reflective coating and a patterned photoresist film sequentially formed in that order on a substrate;
    applying a first DC voltage to the electrostatic chuck to electrostatically absorb the target object thereto;
    introducing a processing gas into the processing chamber;
    generating a plasma to perform an etching process by applying a high frequency power to one of the first electrode and the second electrode;
    applying a second DC voltage to one of the first electrode and the second electrode while etching the anti-reflective coating such that a pattern dimension of the etched anti-reflective coating is smaller by a predetermined value than a pattern dimension of the patterned photoresist film; and
    etching the etching target film into a pattern dimension smaller than the pattern dimension of the photoresist film by using the etched anti-reflective coating as an etching mask, wherein
    the second DC voltage is applied to the first electrode to sputter a polymer adhered to the first electrode while etching the anti-reflective coating so that the sputtered polymer is attached to a sidewall of an etched portion of the anti-reflective coating.

7. The plasma etching method of claim 6, wherein the second DC voltage is applied to the first electrode and is in a range approximately from −200 V to −1500 V.

8. The plasma etching method of claim 6, wherein a residual amount of the patterned photoresist film is increased when the second DC voltage is applied to the first electrode.

9. The plasma etching method of claim 6, wherein the second DC voltage has a negative value when applied to the first electrode and a positive value when applied to the second electrode.

10. The plasma etching method of claim 6, wherein a width of an opening of the etched anti-reflective coating is smaller by the predetermined value than a width of a corresponding opening of the patterned photoresist film, and wherein
    a width of an opening of the etched target film is small than a width of a corresponding opening of the patterned photoresist film.

* * * * *